(12) United States Patent
Jung et al.

(10) Patent No.: US 8,477,094 B2
(45) Date of Patent: Jul. 2, 2013

(54) SHIFT REGISTER AND DISPLAY DEVICE USING THE SAME

(75) Inventors: Shanghoon Jung, Goyang-si (KR); Juhnsuk Yoo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 314 days.

(21) Appl. No.: 12/845,332

(22) Filed: Jul. 28, 2010

(65) Prior Publication Data

US 2011/0157124 A1    Jun. 30, 2011

(30) Foreign Application Priority Data

Dec. 30, 2009 (KR) .................. 10-2009-0133572

(51) Int. Cl.
 G09G 3/36 (2006.01)
 G09G 5/00 (2006.01)
 G06F 3/038 (2006.01)
 G11C 19/00 (2006.01)

(52) U.S. Cl.
 USPC .............. 345/100; 345/204; 345/98; 345/99; 377/64

(58) Field of Classification Search
 USPC .................. 345/204, 98–100; 377/64–81
 See application file for complete search history.

(56) References Cited

U.S. PATENT DOCUMENTS

| | | | | |
|---|---|---|---|---|
| 7,636,412 | B2* | 12/2009 | Tobita | 377/64 |
| 8,155,261 | B2* | 4/2012 | Hu | 377/64 |
| 2007/0274433 | A1* | 11/2007 | Tobita | 377/64 |
| 2009/0115792 | A1* | 5/2009 | Otose et al. | 345/559 |

* cited by examiner

*Primary Examiner* — Bipin Shalwala
*Assistant Examiner* — Ilana Spar
(74) *Attorney, Agent, or Firm* — Brinks Hofer Gilson & Lione

(57) ABSTRACT

A shift register comprises a plurality of stages, which includes a (n−3)-th (where n is a positive integer) stage to a (n+3)-th stage, supplied with gate shift clocks which are sequentially delayed, a forward gate start pulse, a reverse gate start pulse, a carry signal, a gate high voltage, and a gate low voltage lower than the gate high voltage, and connected to each other in cascade, wherein the n-th stage, supplied with a (n−1)-th gate shift clock, an n-th gate shift clock, and a (n+1)-th gate shift clock, includes a scan pulse output unit, a carry signal output unit, and a shift direction changing switch circuit.

18 Claims, 14 Drawing Sheets

SHIFT REGISTER AND DISPLAY DEVICE USING THE SAME

This application claims the priority and the benefit under 35 U.S.C. §119(a) on Patent Application No. 10-2009-0133572 filed in Republic of Korea on Dec. 30, 2009 the entire contents of which are hereby incorporated by reference.

BACKGROUND

1. Field of the Invention

This document relates to a shift register and a display device using the same.

2. Discussion of the Related Art

Recently, various flat panel display devices have been developed that have reduced weight and bulk and are thus capable of overcoming the disadvantages of a cathode ray tube (CRT) display.

A scan driving circuit used in the flat panel display generally sequentially supplies scan pluses for scan lines using a shift register.

The shift register of the scan driving circuit includes, as shown in FIG. 1, stages ST(n−1) to ST(n+2) each consisting of thin film transistors (TFTs). The stages are connected to each other in cascade to generate outputs Vout(n−1) to Vout(n+2). The reference numerals "C1 to C4" in FIG. 1 denote four-phase clocks provided to the stages.

Each of the stages ST(n−1) to ST(n+2) includes a Q node for controlling a pull-up transistor, and a Q bar (QB) node for controlling a pull-down transistor. In addition, each of the stages ST(n−1) to ST(n+2) includes switch circuits which charge and discharge the Q node and QB node in response to a carry signal output from a previous stage, a carry signal output from a next stage, and the clock signals C1 to C4.

The outputs Vout(n−1) to Vout(n+2) from the stages ST(n−1) to ST(n+2) of the shift register are used as scan pluses applied to the scan lines of the display device and the carry signals applied to the previous and next stages. Thus, when, as shown in FIG. 1, due to conductive particles CP mixed in the course of a manufacturing process or a poor pattern, the scan lines connected to output nodes of the stages ST(n−1) to ST(n+2) are short-circuited to other scan lines or DC voltage sources VDD and VSS, the carry signals are not transmitted and thus the shift register is wrongly operated. For example, as shown in FIG. 1, when an n-th (where n is a positive integer) scan line connected to the output node of the n-th stage ST(n) is short-circuited to a (n+1)-th scan line connected to the output node of the (n+1)-th stage ST(n+1), the stages following the n-th stage ST(n) is not operated normally.

Meanwhile, a scan direction in the shift register is required to vary depending on a panel structure or a driving method of the display device. Therefore, the shift register preferably has a function capable of changing a shift direction.

BRIEF SUMMARY

According to an exemplary embodiment of the present disclosure, there is provided a shift register comprising a plurality of stages, which includes a (n−3)-th (where n is a positive integer) stage to a (n+3)-th stage, supplied with gate shift clocks which are sequentially delayed, a forward gate start pulse, a reverse gate start pulse, a carry signal, a gate high voltage, and a gate low voltage lower than the gate high voltage, and connected to each other in cascade.

Here, the n-th stage, supplied with a (n−1)-th gate shift clock, an n-th gate shift clock, and a (n+1)-th gate shift clock, includes, a scan pulse output unit configured to output an n-th scan pulse depending on a voltage at a Q node via a first output node, a carry signal output unit configured to output an n-th carry signal depending on a voltage at the Q node via a second output node, and a shift direction changing switch circuit configured to charge the Q node in response to a (n−3)-th carry signal output from the (n−3)-th stage, in a forward shift mode where the forward gate start pulse is generated, and, to charge the Q node in response to a (n+3)-th carry signal output from the (n+3)-th stage, in a reverse shift mode where the reverse gate start pulse is generated.

According to an exemplary embodiment of the present disclosure, there is provided a display device comprising a display panel provided with a plurality of data lines and scan lines intersecting each other, and a plurality of pixels arranged in a matrix, a data driving circuit configured to supply data voltages for the data lines, and a scan driving circuit configured to sequentially supply scan pulses for the scan lines.

Here, the scan driving circuit has a plurality of stages which are supplied with gate shift clocks which are sequentially delayed, a forward gate start pulse, a reverse gate start pulse, a carry signal, a gate high voltage, and a gate low voltage lower than the gate high voltage, and connected to each other in cascade.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE DRAWINGS AND THE PRESENTLY PREFERRED EMBODIMENTS

Figure 1:
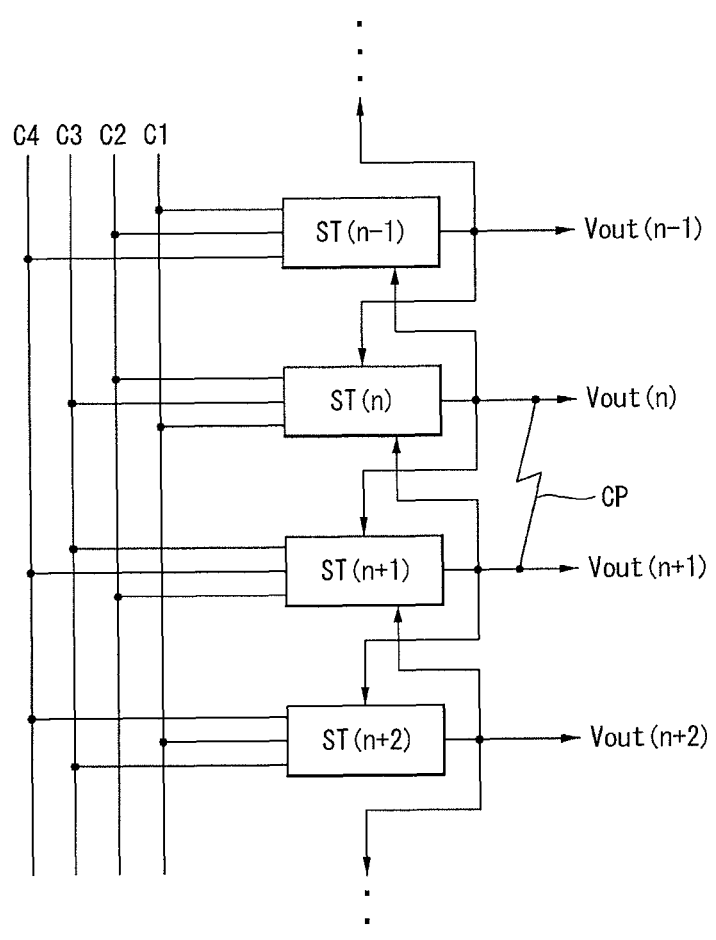
FIG. 1 is a schematic diagram illustrating a configuration of a shift register according to a related art.

With reference to the accompanying drawings, exemplary embodiments of this document will be described. Like reference numerals designate like elements throughout the specification. In the following explanations, when a detailed description of well-known functions or configurations related to this document is determined to unnecessarily cloud a gist of this document, the detailed description thereof will be omitted.

Names of the respective elements used in the following explanations are selected only for convenience of writing the specification and may be thus different from those in actual products.

Figure 2:
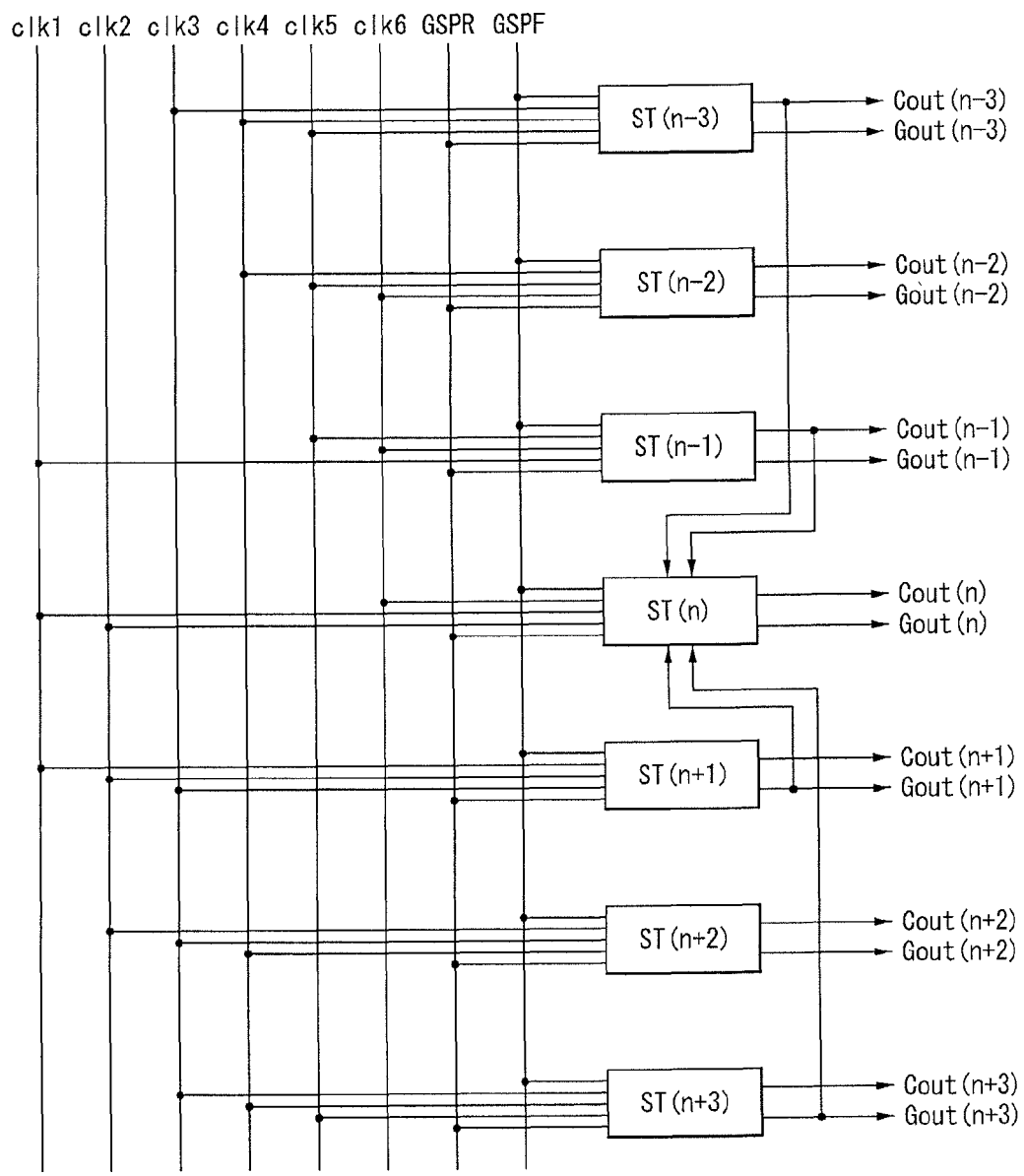
FIG. 2 is a schematic diagram illustrating a configuration of a shift register according to an embodiment of this document.
Figure 3:
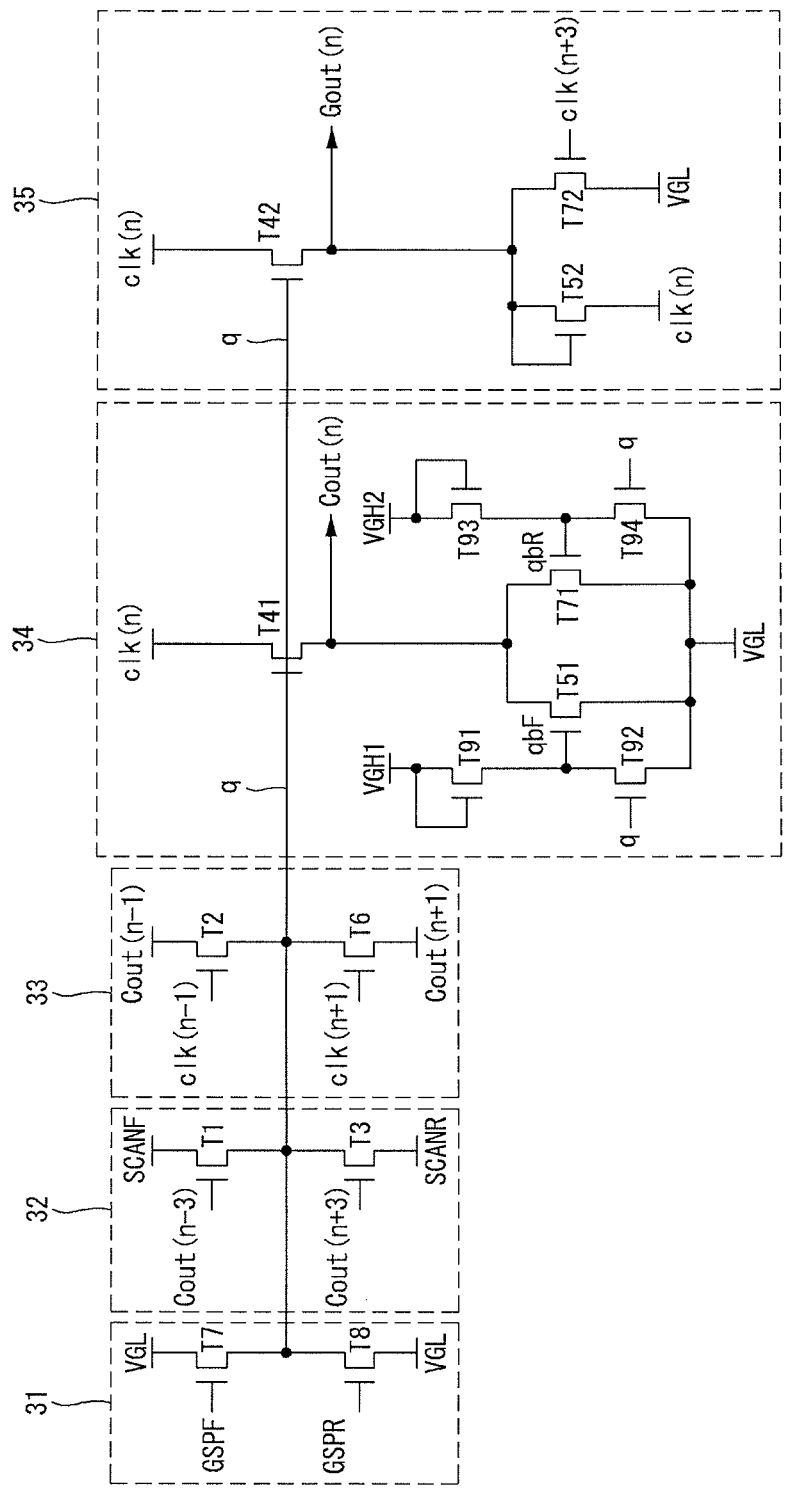
FIG. 3 is a detailed circuit diagram illustrating a circuit configuration of the n-th stage shown in FIG. 2.

FIG. 2 is a schematic diagram illustrating a configuration of a shift register according to an embodiment of this document. FIG. 3 is a detailed circuit diagram illustrating a circuit configuration of the n-th stage shown in FIG. 2.

Referring to FIGS. 2 and 3, the shift register according to an embodiment of this document is provide with a plurality of stages ST(n−3) to ST(n+3) connected to each other in cascade.

Each of the stages ST(n−3) to ST(n+3) separately outputs a carry signal Cout and a scan pulse (or gate pulse) Gout. The shift register, in a forward shift mode, sequentially generates outputs in an order of the (n−3)-th stage ST(n−3), the (n−2)-th stage ST(n−2), the (n−1)-th stage ST(n−1), the n-th stage ST(n), the (n+1)-th ST(n+1), the (n+2)-th ST(n+2), and the (n+3)-th ST(n+3). The shift register, in a reverse shift mode, sequentially generates outputs in an order reverse to the forward shift mode, that is, in an order of the (n+3)-th stage ST(n+3), the (n+2)-th stage ST(n+2), the (n+1)-th stage ST(n+1), the n-th stage ST(n), the (n−1)-th ST(n−1), the (n−2)-th ST(n−2), and the (n−3)-th ST(n−3).

The shift register outputs the carry signals Cout which partially overlap each other by a predetermined time, and the scan pulses Gout which partially overlap each other by a predetermined time. Here, the carry signals Gout and the gate pulses Gout have high sections with a relatively high level and low sections with a relatively low level, the levels of which are substantially the same as those of gate shift clocks described later. In addition, the high section consists of a first half and a second half. In this case, for example, in the forward shift mode, the first halves of the n-th carry signal Cout(n) and the n-th scan pulse Gout(n) respectively overlap the second halves of the (n−1)-th carry signal Cout(n−1) and the (n−1)-th scan pulse Gout(n−1) output from the (n−1)-th stage ST(n−1). Also, the second halves of the n-th carry signal Cout(n) and the n-th scan pulse Gout(n) respectively overlap the first halves of the (n+1)-th carry signal Cout(n+1) and the (n+1)-th scan pulse Gout(n+1) output from the (n+1)-th stage ST(n+1). In order to prevent a wrong operation due to the overlapped outputs, the stages ST(n−3) to ST(n+3) of the shift register are supplied with three gate shift clocks among the six-phase gate shift clocks clk1 to clk6 which partially overlap each other and sequentially delayed by a predetermined time.

The six-phase gate shift clocks clk1 to clk6 varies between a gate high voltage VGH and a gate low voltage VGL. The gate high voltage VGH and the gate low voltage VGL are supplied for the stages ST(n−3) to ST(n+3). The gate high voltage VGH is set to a voltage equal to or more than the threshold voltages of the TFTs formed on a TFT array panel of the display device, and the gate low voltage VGL is set to a voltage equal to or less than the threshold voltages of the TFTs formed on the TFT array panel of the display device. The gate high voltage VGH may be set to about 20V and the gate low voltage VGL may be set to about −5V. In addition, a forward gate start pulse GSPF and a reverse gate start pulse GSPR are supplied for the stages ST(n−3) to ST(n+3).

Each of the stages ST(n−3) to ST(n+3) separately generates the carry signal Cout and the scan pulse Gout. In other words, each of the stages ST(n−3) to ST(n+3) has two output nodes, a first output node where the scan pulse Gout is output and a second output node where the carry signal Cout is output. In FIG. 2, other carry signals are omitted except for the carry signals Cout(n−1), Cout(n−3), Cout(n+1) and Cout(n+3).

FIG. 3 shows a circuit configuration of the n-th stage ST(n). Circuit configurations of the remaining stages are substantially the same as that shown in FIG. 3. The (n−1)-th to (n+1)-th gate shift clocks clk(n−1) to clk(n+1) are input to clock terminals of the n-th stage ST(n).

The n-th stage ST(n) comprises an initialization switch circuit 31 which initializes a Q node q in response to the gate start pulses GSPF and GSPR, a shift direction changing switch circuit 32 which changes a scan direction, a Q node voltage maintaining switch circuit 33 which maintains a voltage at the Q node q as the gate high voltage VGH during a constant time, a carry signal output unit 34 which outputs the n-th carry signal Cout(n) depending on a voltage at the Q node, and a scan pulse output unit 35 which outputs the n-th scan pulse Gout(n) depending on the voltage at the Q node q.

The initialization switch circuit 31 initializes the Q node q by discharging the Q node q to the gate low voltage VGL in response to the gate start pulses GSPF and GSPR. The initialization switch circuit 31 comprises TFTs T7 and T8. The TFT T7 makes a current path between the gate low voltage source VGL and the Q node q in response to the forward gate start pulse GSPF, thereby initializing a voltage at the Q node q to the gate low voltage VGL. A gate terminal of the TFT T7 is applied with the forward gate start pulse GSPF, and a source terminal of the TFT T7 is applied with the gate low voltage VGL. A drain terminal of the TFT T7 is connected to the Q node q. The TFT T8 makes a current path between the gate low voltage source VGL and the Q node q in response to the reverse gate start pulse GSPR, thereby initializing a voltage at the Q node q to the gate low voltage VGL. A gate terminal of the TFT T8 is applied with the reverse gate start pulse GSPR, and a source terminal of the TFT T8 is applied with the gate low voltage VGL. A drain terminal of the TFT T8 is connected to the Q node q.

The shift direction changing switch circuit 32 charges, in the forward shift mode, the Q node q to the gate high voltage VGH in response to the (n−3)-th carry signal Cout(n−3) from the (n−3)-th stage ST(n−3), whereas it charges, in the reverse shift mode, the Q node q to the gate high voltage VGH in response to (n+3)-th carry signal Cout(n+3) from the (n+3)-th stage ST(n+3). The shift direction changing switch circuit 32 comprises TFTs T1 and T3. The TFT T1 transmits, in the forward shift mode, the gate high voltage VGH to the Q node q in response to the (n−3)-th carry signal Cout(n−3). A gate terminal of the TFT T1 is applied with the (n−3)-th carry signal Cout(n−3). A source terminal of TFT T1 is applied with the gate high voltage VGH in the forward shift mode, and is applied with the gate low voltage VGL in the reverse shift mode. A drain terminal of the TFT T1 is connected to the Q node q. The TFT T3 transmits, in the reverse shift mode, the gate high voltage VGH to the Q node q in response to the (n+3)-th carry signal Cout(n+3). A gate terminal of the TFT T3 is applied with the (n+3)-th carry signal Cout(n+3). A source terminal of the TFT T3 is applied with the gate low voltage VGL in the forward shift mode, and is applied with the gate high voltage VGH in the reverse shift mode. A drain terminal of the TFT T3 is connected to the Q node q.

The Q node voltage maintaining switch circuit 33 transmits, in the forward shift mode, the (n−1)-th carry signal Cout(n−1) from the (n−1)-th stage ST(n−1) to the Q node q in response to the (n−1)-th gate shift clock clk(n−1), thereby maintaining the Q node q as the gate high voltage VGH. The Q node voltage maintaining switch circuit 33 transmits, in the reverse shift mode, the (n+1)-th carry signal Cout(n+1) from the (n+1)-th stage ST(n+1) to the Q node q in response to the (n+1)-th gate shift clock clk(n+1), thereby maintaining the Q node q as the gate high voltage VGH. The Q node voltage maintaining switch circuit 33 comprises TFTs T2 and T6. The TFT T2 transmits, in the forward shift mode, the (n−1)-th carry signal Cout(n−1) to the Q node q in response to the (n−1)-th gate shift clock clk(n−1). A gate terminal of the TFT T2 is applied with the (n−1)-th gate shift clock clk(n−1). A source terminal of the TFT T2 is applied with the (n−1)-th carry signal Cout(n−1). A drain terminal of the TFT T2 is connected to the Q node q. The TFT T6 transmits, in the reverse shift mode, the (n+1)-th carry signal Cout(n+1) to the Q node q in response to the (n+1)-th gate shift clock clk(n+1). A gate terminal of the TFT T6 is applied with the (n+1)-th gate shift clock clk(n+1). A source terminal of the TFT T6 is applied with the (n+1)-th carry signal Cout(n+1). A drain terminal of the TFT T6 is connected to the Q node q.

The carry signal output unit 34 charges the first output node depending on a voltage at the Q node q, and discharges the first output node depending on a voltage at the Q node q. The carry signal output unit 34 comprises a TFT T41, a TFT T51, and a TFT T71. The TFT T41, which is a pull-up transistor, charges the first output node to a voltage of the n-th gate shift clock clk(n) in response to a voltage at the Q node q. A gate terminal of the TFT T41 is connected to the Q node q, and a drain terminal of the TFT T41 is connected to the first output node. A source terminal of the TFT T41 is applied with the n-th gate shift clock clk(n). The TFT T51, which is a pull-down transistor, discharges a voltage at the output node to the gate low voltage VGL depending on a voltage at a first QB node qbF. A gate terminal of the TFT T51 is connected to the first QB node qbF, and a drain terminal of the TFT T51 is connected to the first output node. A source terminal of the TFT T51 is applied with the gate low voltage VGL. The TFT T71, which is a pull-down transistor, discharges a voltage at the first output node to the gate low voltage VGL depending on a voltage at a second QB node qbR. A gate terminal of the TFT T71 is connected to the second QB node qbR, and a drain terminal of the TFT T71 is connected to the first output node. A source terminal of the TFT T71 is applied with the gate low voltage VGL.

The carry signal output unit 34 further comprises TFTs T91 to T94. The TFTs T91 and T92 charge and discharge the QB node qbF to a first gate high voltage VGH1 depending on a voltage at the Q node q. The TFT T91, which works as a diode, transmits the first gate high voltage VGH1 to the first QB node qbF to charge the first QB node qbF. A gate terminal and a source terminal of the TFT T91 are short-circuited to each other. The gate terminal and the source terminal of the TFT T91 are applied with the first gate high voltage VGH1. A drain terminal of the TFT T91 is connected to the first QB node qbF. The TFT T92 discharges the first QB node qbF depending on a voltage at the Q node q. A gate terminal of TFT T92 is connected to the Q node q, and a drain terminal of the TFT T92 is connected to the first QB node qbF. A source terminal of the TFT T92 is applied with the gate low voltage VGL. The TFTs T93 and T94 charge and discharge the second QB node qbR to a second gate high voltage VGH2. The TFT T93, which works as a diode, transmits the second gate high voltage VGH2 to the second QB node qbR to charges the second QB node qbR. A gate terminal and a source terminal of the TFT T93 are short-circuited to each other. The gate terminal and the source terminal of the TFT T93 are applied with the second gate high voltage VGH2. A drain terminal of the TFT T93 is connected to the second QB node qbR. The TFT T94 discharges the second QB node qbR depending on a voltage at the Q node q. A gate terminal of the TFT T94 is connected to the Q node q, and a drain terminal of the TFT T94 is connected to the second QB node qbR. A source terminal of the TFT T94 is applied with the gate low voltage VGL. Meanwhile, when the TFTs T51 and T71 are applied with a DC voltage for a long time, their threshold voltages Vth may be shifted due to the gate bias stress. In order to restore such a shift of the threshold voltage, the first gate high voltage VGH1 and the second gate high voltage VGH2 are provided alternately at a predetermined cycle. During the next I-th (where I is a positive integer) frame period, the TFT T91 may be applied with the gate low voltage VGL, and the TFT T93 may be applied with the second gate high voltage VGH2. Therefore, when the gate high voltage VGH1 is applied to the first QB node qbF, the gate low voltage VGL is applied to the second QB node qbR. In contrast, when the gate low voltage VGL is applied to the first QB node qbF, the gate high voltage VGH2 is applied to the second QB node qbR.

The scan pulse output unit 35 charges the second output node depending on a voltage at the Q node q, and discharges the second output node depending a voltage of the (n+3)-th gate shift clock clk(n+3). The scan pulse output unit 35 comprises TFTs T42, T52 and T72. The TFT T42, which is a pull-up transistor, charges the second output node to a voltage of the n-th gate shift clock clk(n) depending on a voltage at the Q node q. A gate terminal of the TFT T42 is connected to the Q node q, and a drain terminal of the TFT T42 is connected to the second output node. A source terminal of the TFT T42 is applied with the n-th gate shift clock clk(n). The TFT T52, which works as diode, discharges the second output node to the gate low voltage VGL when a voltage of the n-th gate shift clock clk(n) is the gate low voltage VGL. A gate terminal and a drain terminal of the TFT T52 are connected to the second output node and function as a cathode of the diode. A source terminal of the TFT T52 is applied with the n-th gate shift clock clk(n) and functions as a cathode of the diode. When the gate high voltage VGH of the n-th gate shift clock clk(n) is applied to the source terminal of the TFT T52, the TFT T52 is turned off to block the current path between the second output node and an n-th gate shift clock line which transmits the n-th gate shift clock clk(n). The TFT T72 discharges a voltage at the second output node to the gate low voltage VGL in response to the (n+3)-th gate shift clock clk(n+3). A gate terminal of the TFT T72 is applied with the (n+3)-th gate shift clock clk(n+3). A drain terminal of the TFT T72 is connected to the second output node. A source terminal of the TFT T72 is applied with the gate low voltage VGL.

A forward shift operation in the n-th stage ST(n) will be sequentially described with reference to FIGS. 4 to 6.

Figure 4:
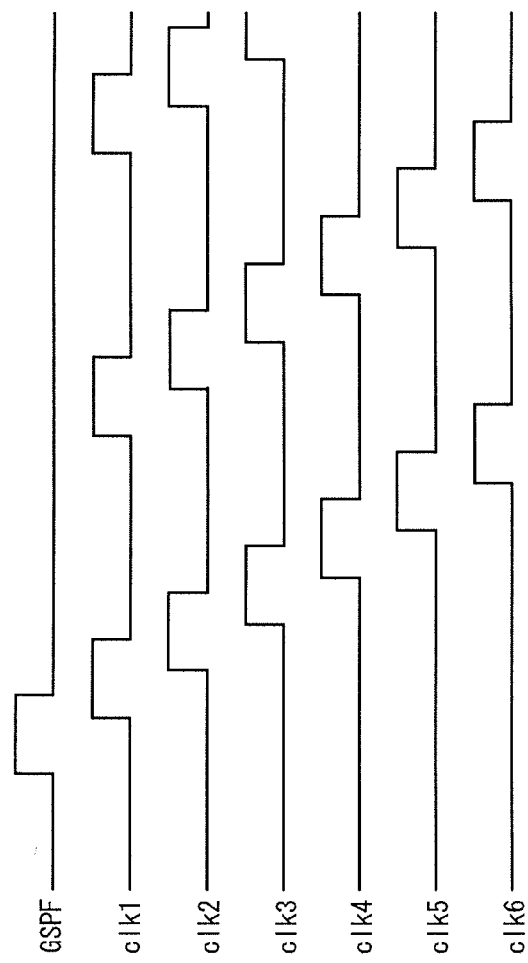
FIG. 4 is a waveform diagram of a gate start pulse and six-phase gate shift clocks in a forward shift mode.
Figure 5:
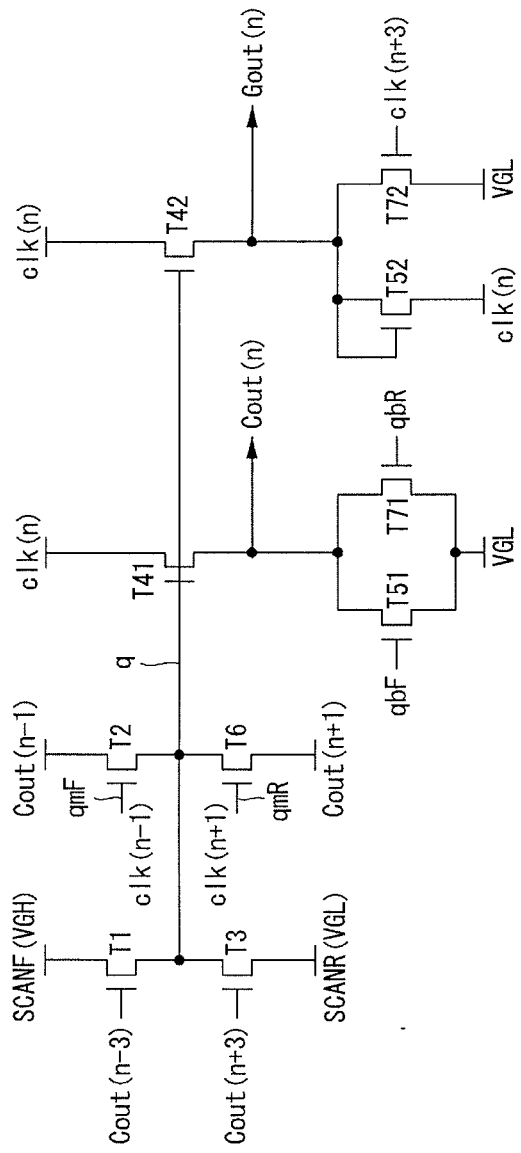
FIG. 5 is a circuit diagram illustrating a forward shift operation in the n-th stage shown in FIG. 3.
Figure 6:
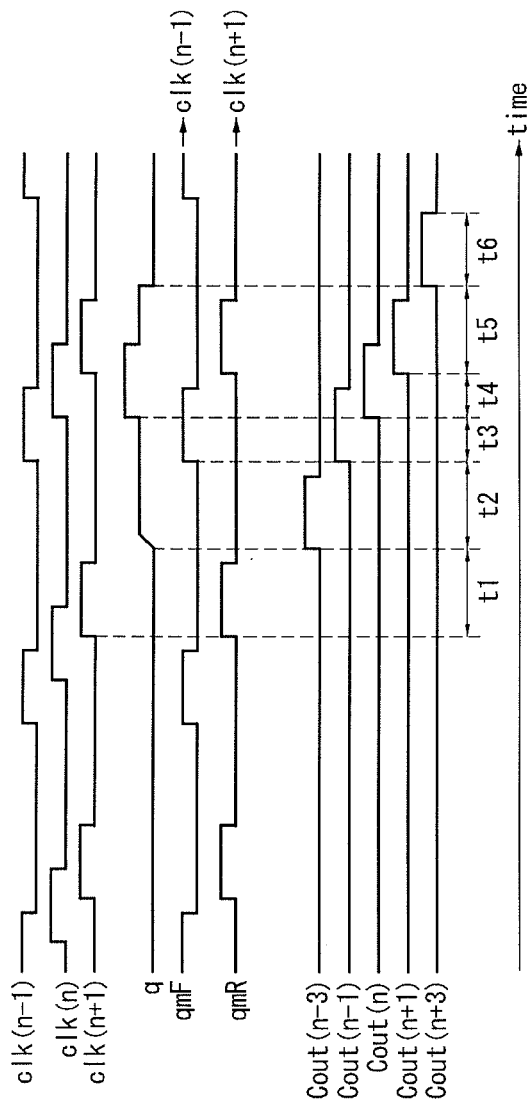
FIG. 6 is a waveform diagram of input and output signals of the n-th stage shown in FIG. 5.

Referring to FIGS. 4 to 6, the forward gate start pulse GSPF is generated in the forward shift mode, and the six-phase gate shift clocks clk1 to clk6 are generated in the sequentially delayed manner from the first gate shift clock clk1 to the sixth gate shift clock clk6. In the forward shift mode, the TFT T1 is applied with a gate high voltage SCANF(VGH), and the TFT T3 is applied with a gate low voltage SCANR(VGL).

During the time t1, the Q node q of the n-th stage ST(n) is maintained as the gate low voltage VGL. During the time t2, the (n−3)-th carry signal Cout(n−3) and the (n−3)-th scan pulse Gout(n−3) are output from the (n−3)-th stage (n−3). The TFT T1 charges the Q node q to the gate high voltage SCANF (VGH) in response to the (n−3)-th carry signal Cout(n−3) during the time t2.

After the (n−2)-th stage ST(n−2) outputs the (n−2)-th carry signal Cout(n−2) and the (n−2)-th scan pulse Gout(n−2), the (n−1)-th gate shift clock clk(n−1) is generated during the time t3, and the (n−1)-th stage ST(n−1) outputs the (n−)-th carry signal Cout(n−1) and the (n−1)-th scan pulse Gout(n−1). The TFT T2 transmits the (n−1)-th carry signal Cout(n−1) to the Q node q in response to the (n−1)-th gate shift clock clk(n−1) provided via a node qmF during the time t3, thereby maintaining a voltage at the Q node q as the gate high voltage VGH.

During the time t4, the n-th gate shift clock clk(n) is generated. The TFT T41 and the TFT T42 enable, during the time t4, the n-th carry signal Cout(n) and the n-th scan pulse Gout(n) to be output from the first and second output nodes, respectively, by a bootstrapping between the gate terminals which are charged to the gate high voltage VGH and the source terminals which are applied with the n-th gate shift clock clk(n). Thereafter, during the time t5, when the (n+1)-th gate shift clock clk(n+1) is generated, the (n+1)-th stage ST(n+1) outputs the (n+1)-th carry signal Cout(n+1) and the (n+1)-th scan pulse Gout(n+1). The TFT T6 transmits the (n+1)-th carry signal Cout(n+1) to the Q node q in response to the (n+1)-th gate shift clock clk(n+1) provided via a node qmR, thereby maintaining a voltage at the Q node q as the gate high voltage VGH.

During the time t6, the (n+3)-th stage ST(n+3) outputs the (n+3)-th carry signal Cout(n+3) and the (n+3)-th scan pulse Gout(n+3). The TFT T3 transmits the gate low voltage SCANR(VGL) to the Q node q in response to the (n+3)-th carry signal Cout(n+3), thereby discharging a voltage at the Q node q to the gate low voltage VGL.

A reverse shift operation in the n-th stage ST(n) will be sequentially described with reference to FIGS. 7 to 9.

Figure 7:
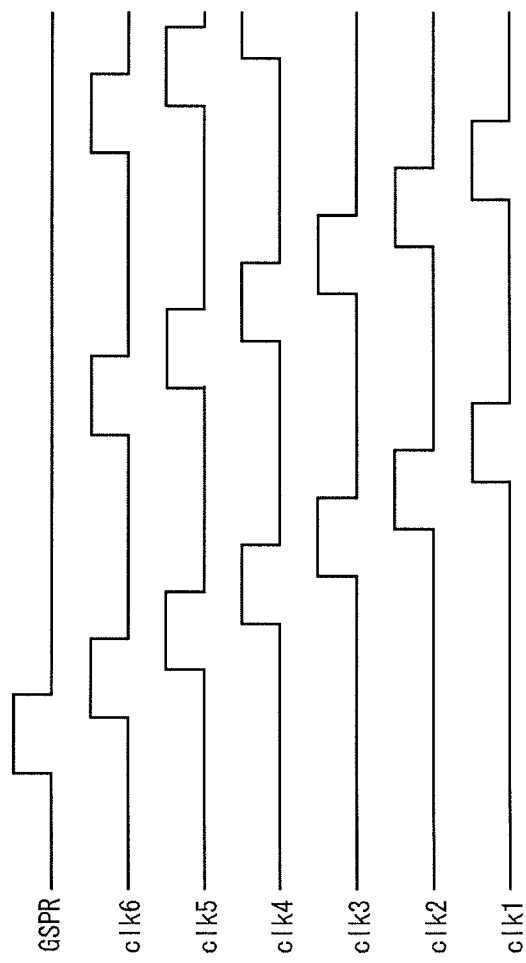
FIG. 7 is a waveform diagram of a gate start pulse and six-phase gate shift clocks in a reverse shift mode.
Figure 8:
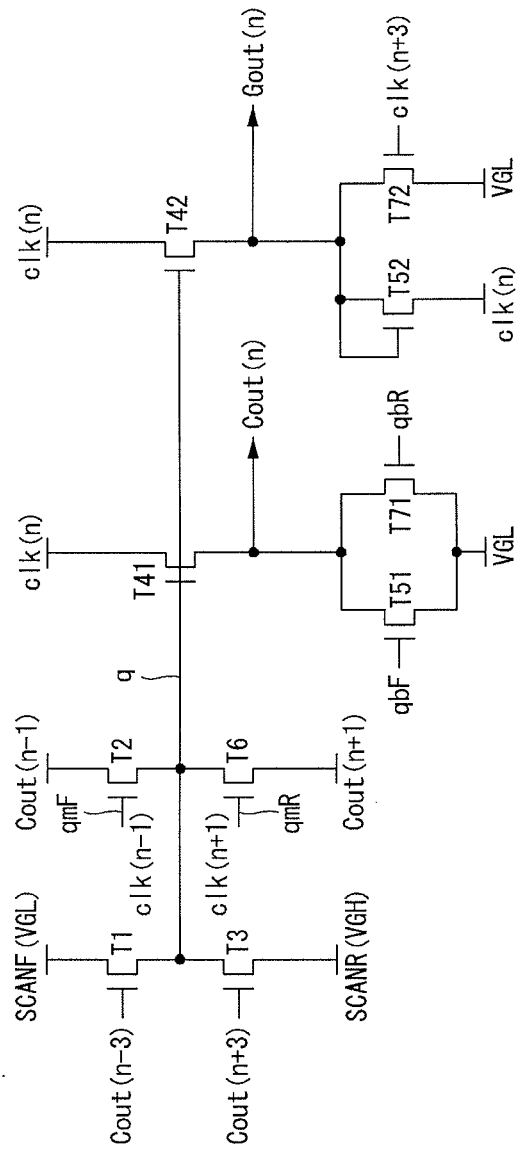
FIG. 8 is a circuit diagram illustrating a reverse shift operation in the n-th stage shown in FIG. 7.
Figure 9:
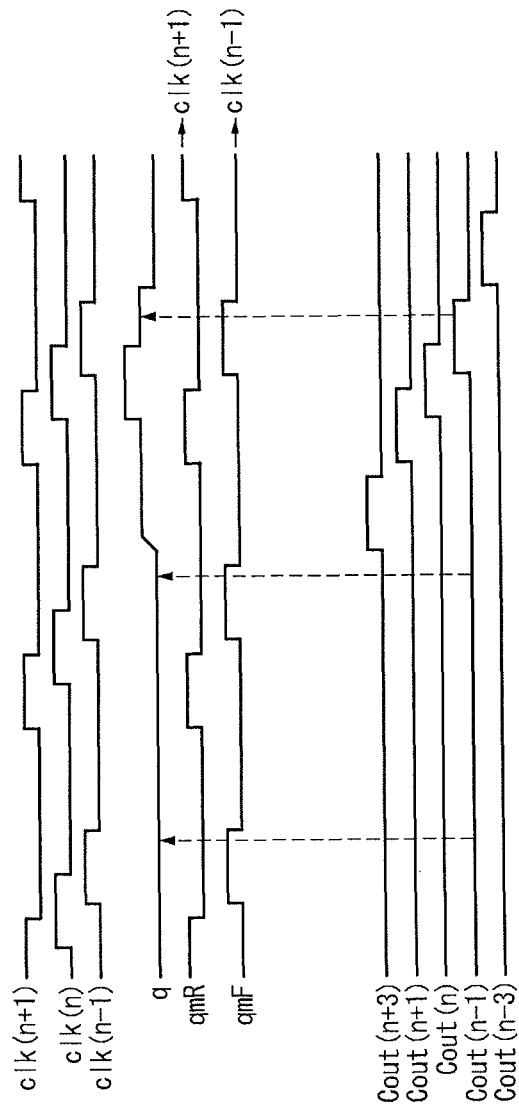
FIG. 9 is a waveform diagram of input and output signals of the n-th stage shown in FIG. 8.

Referring to FIGS. 7 to 9, the reverse gate start pulse GSPR is generated in the reverse shift mode, and the six-phase gate shift clocks clk1 to clk6 are generated in the sequentially delayed manner from the sixth gate shift clock clk6 to the first gate shift clock clk1. In the reverse shift mode, the TFT T1 is applied with a gate low voltage SCANF(VGL), and the TFT T3 is applied with a gate high voltage SCANR(VGH).

When the (n+3)-th stage ST(n+3) outputs the (n+3)-th carry signal Cout(n+3) and the (n+3)-th scan pulse Gout(n+3), the TFT T3 charges the Q node q to the gate high voltage SCANR(VGH) in response to the (n+3)-th carry signal Cout (n+3).

Subsequently, the (n+1)-th gate shift clock clk(n+1) is generated, and the (n+1)-th stage ST(n+1) outputs the (n+1)-th carry signal Cout(n+1) and the (n+1)-th scan pulse Gout(n+1). The TFT T6 transmits the (n+1)-th carry signal Cout(n+1) to the Q node q in response to the (n+1)-th gate shift clock clk(n+1) provided via the node qmR, thereby maintaining a voltage at the Q node q as the gate high voltage VGH.

When the n-th gate shift clock clk(n) is generated, the TFT T41 and the TFT T42 enable, during the time t4, the n-th carry signal Cout(n) and the n-th scan pulse Gout(n) to be output from the first and second output nodes, respectively, by a bootstrapping between the gate terminals which are charged to the gate high voltage VGH and the source terminals which are applied with the n-th gate shift clock clk(n). Thereafter, when the (n−1)-th gate shift clock clk(n−1) is generated, the (n−1)-th stage ST(n−1) outputs the (n−1)-th carry signal Cout(n−1) and the (n−1)-th scan pulse Gout(n−1). The TFT T2 transmits the (n−1)-th carry signal Cout(n−1) to the Q node q in response to the (n−1)-th gate shift clock clk(n−1) provided via the node qmF, thereby maintaining a voltage at the Q node q as the gate high voltage VGH.

When the (n−3)-th stage ST(n−3) outputs the (n−3)-th carry signal Cout(n−3) and the (n−3)-th scan pulse Gout(n−3), the TFT T1 transmits the gate low voltage SCANF(VGL) to the Q node q in response to the (n−3)-th carry signal Cout(n−3), thereby discharging a voltage at the Q node q to the gate low voltage VGL.

Figure 10A:
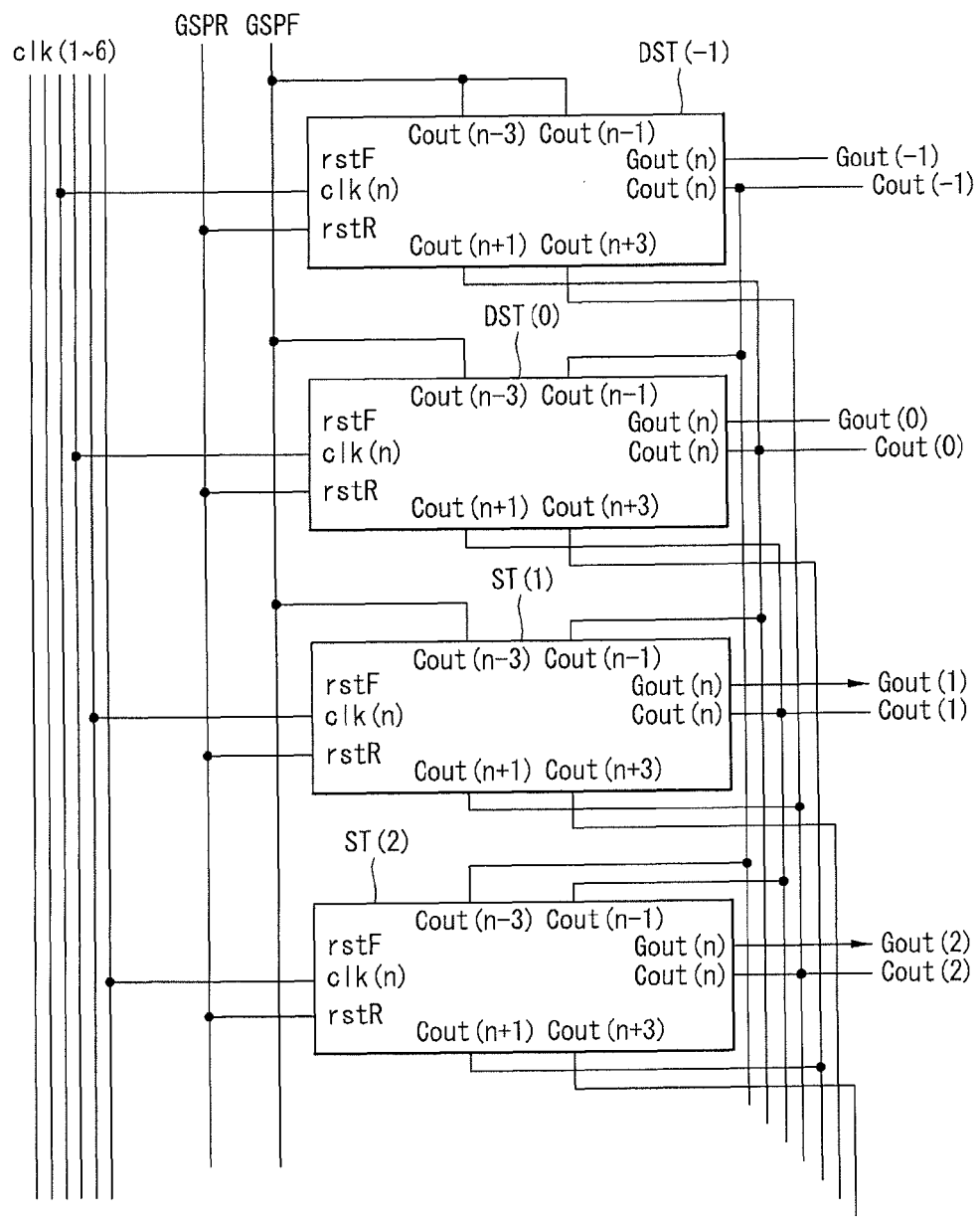
FIGS. 10A to 10C are diagrams illustrating stage configurations of the shift register which sequentially supplies scan pulses for 640 scan lines.
Figure 10B:
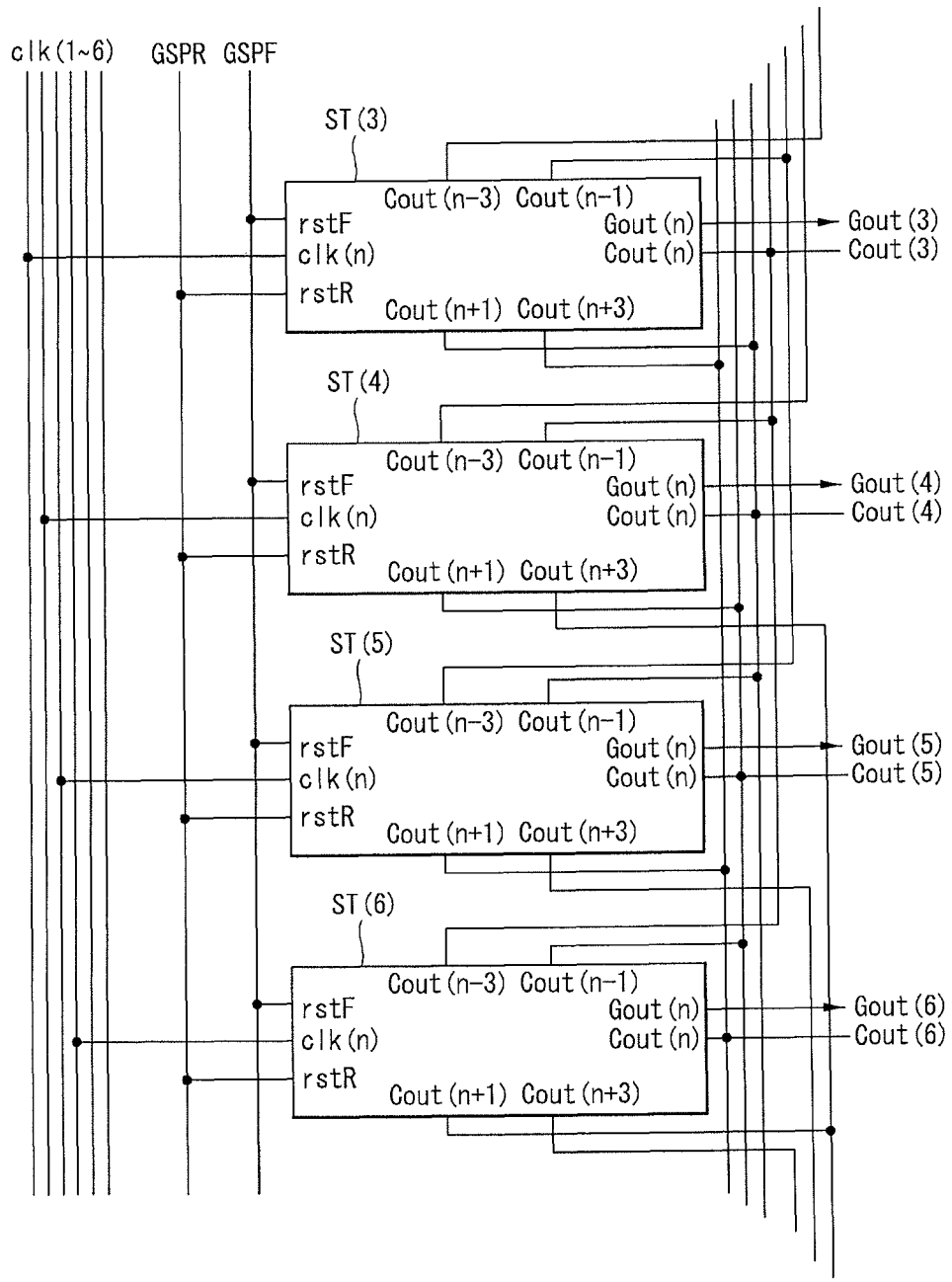
Figure 10C:
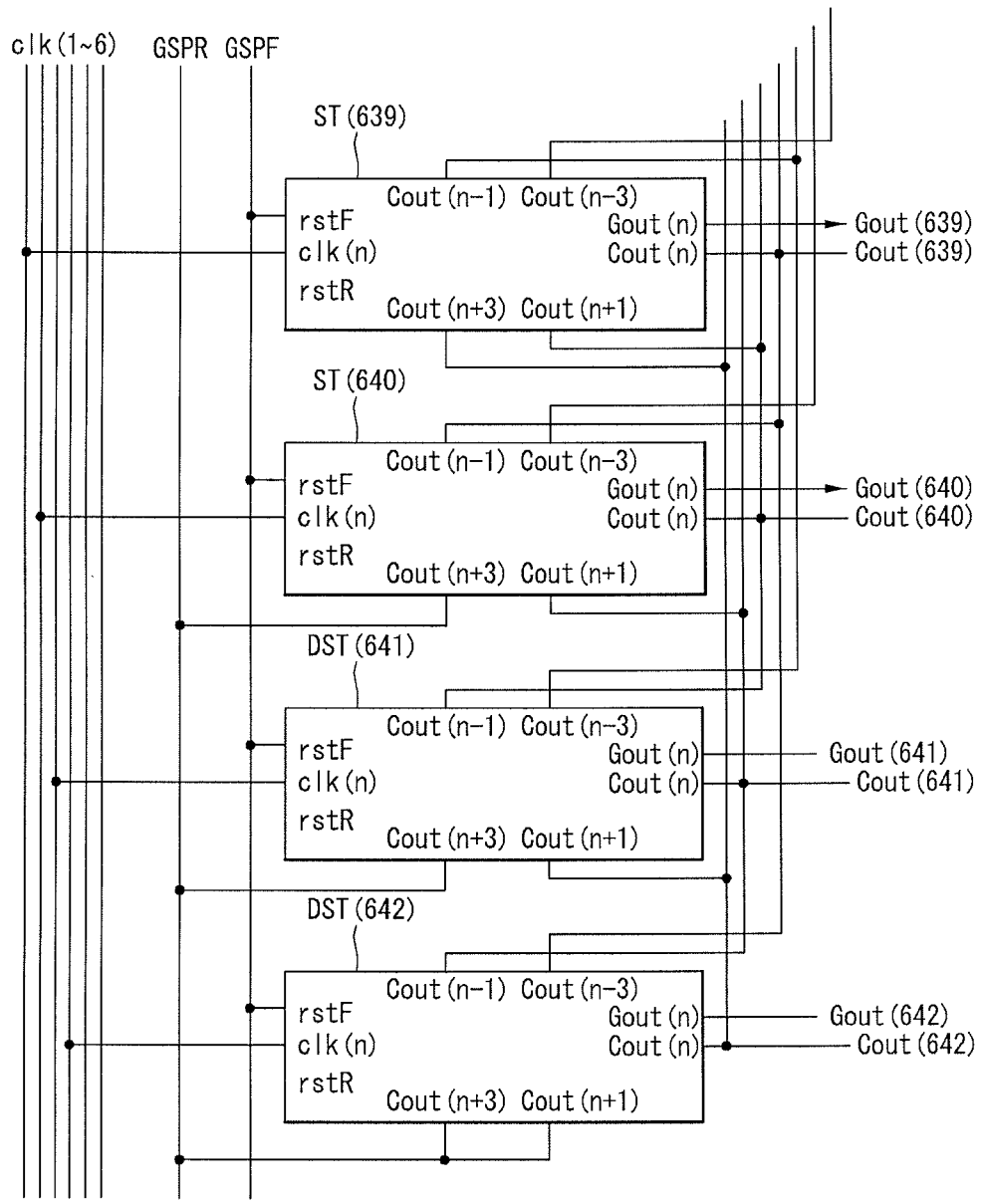

The shift register according to the embodiment of this document comprises m stages which are respectively connected to m scan lines and sequentially supply scan pulses for the m scan lines, and four dummy stages which are not connected to the scan lines. FIGS. 10A to 10C are diagrams illustrating 644 stages including the four dummy stages when the 'm' is 640.

Referring to FIGS. 10A to 10C, the shift register comprises start dummy stages DST(-1) and DST(0) which are not connected to the scan lines, 640 stages ST(1) to ST(640) which sequentially supply the scan pulses for the 640 scan lines, and end dummy stages DST(641) and DST(642) which are not connected to the scan lines.

Each of the stages DST(-1) to DST(642) has reset terminals rstF and rstR which respectively receive the gate start pulses GSPF and GSPR. The first reset terminal rstR is connected to the gate terminal of the TFT T7 shown in FIG. 3, and the second reset terminal rstR is connected to the gate terminal of the TFT T8 shown in FIG. 3. In order to prevent the initialization of the Q nodes q in the start dummy stages DST (-1) and DST (0), and the first and second stages ST(1) and ST(2) due to the generation of the forward gate start pulse GSPF, the reset terminals rstR in the stages DST(-1), DST(0), ST(0) and ST(1) are applied with only the reverse gate start pulse GSPR. In addition, in order to prevent the initialization of the Q nodes q in the end dummy stages DST (641) and DST (642), and the 639th and 640th stages ST(639) and ST(640) due to the generation of the reverse gate start pulse GSPR, the reset terminals rstR in the stages DST(641), DST(642), ST(639) and ST(640) are applied with only the forward gate start pulse GSPF.

A (n−3)-th carry signal input terminal and a (n−1)-th carry signal input terminal in the (−1)-th start dummy stage DST (−1) are supplied with the forward gate start pulse GSPF. Accordingly, the gate terminal of the TFT T1 and the source terminal of the TFT T2 in the (−1)-th start dummy stage DST(−1) are applied with the forward gate start pulse GSPF. Each of (n−3)-th carry signal input terminals in the (0)-th start dummy stage DST(0) and the first stage ST(1) is supplied with the forward gate start pulse GSPF. Therefore, the gate terminals of the TFTs T1 in the (0)-th start dummy stage DST(0) and the first stage ST(1) are applied with the forward gate start pulse GSPF.

A (n+3)-th carry signal input terminal and a (n+1)-th carry signal input terminal in the 642nd end dummy stage DST (642) are supplied with the reverse gate start pulse GSPR. Therefore, the gate terminal of the TFT T3 and the source terminal of the TFT T6 in the 642nd end dummy stage DST (642) are applied with the reverse gate start pulse GSPR. Each of (n+3) carry signal input terminals in the 641st end dummy stage DST(641) and the 640th stage ST(640) is supplied with the reverse gate start pulse GSPR. Therefore, the gate terminals of the TFTs T3 in the 641st end dummy stage DST(641) and the 640th stage ST(640) are applied with the reverse gate start pulse GSPR.

The display device according to an embodiment of this document may include any other display device which sequentially supplies scan pluses for scan lines to write video data in pixels in a line sequential scanning method. For example, the display device may include, but not limited to, a liquid crystal display (LCD), an organic light emitting diode (OLED) display, an electrophoresis display (EPD), or the like.

Figure 11:
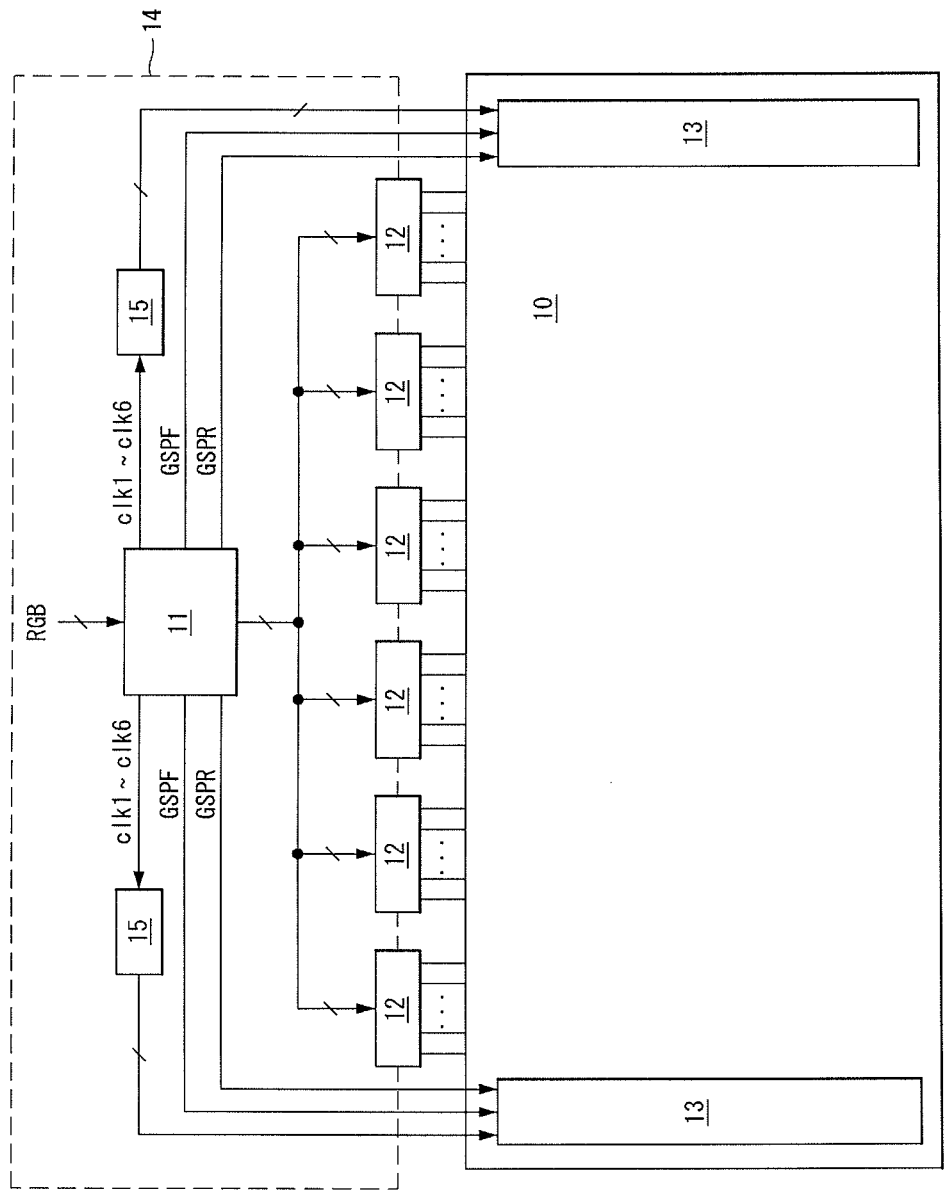
FIG. 11 is a schematic diagram illustrating a display device according to an embodiment of this document.

FIG. 11 is a schematic block diagram illustrating a display device according to an embodiment of this document.

Referring to FIG. 11, the display device comprises a display panel assembly 10, a data driving circuit, a scan driving circuit, a timing controller 11, and so on.

The display panel assembly 10 is provided with data lines and scan lines intersecting each other, and pixels arranged in a matrix. The display panel assembly 10 may be implemented by a display panel assembly of any one of the LCD, the OLED display, and the EPD.

The data driving circuit comprises a plurality of source drive ICs 12. The source drive ICs 12 receives digital video data RGB from the timing controller 11. The source drive ICs 12 convert the digital video data RGB into gamma correction voltages to generate data voltages, in response to source timing control signals from the timing controller 11, and supplies the data voltages for the data lines in the display panel assembly 10 in synchronization with the scan pulses. The source drive ICs 12 may be connected to the data lines in the display panel assembly 10 by a COG (chip on glass) process or a TAB (tape automated bonding) process.

The scan driving circuit comprises first and second level shifters 15, and first and second shift registers 13 connected between the timing controller 11 and the scan lines in the display panel assembly 10.

Figure 12:
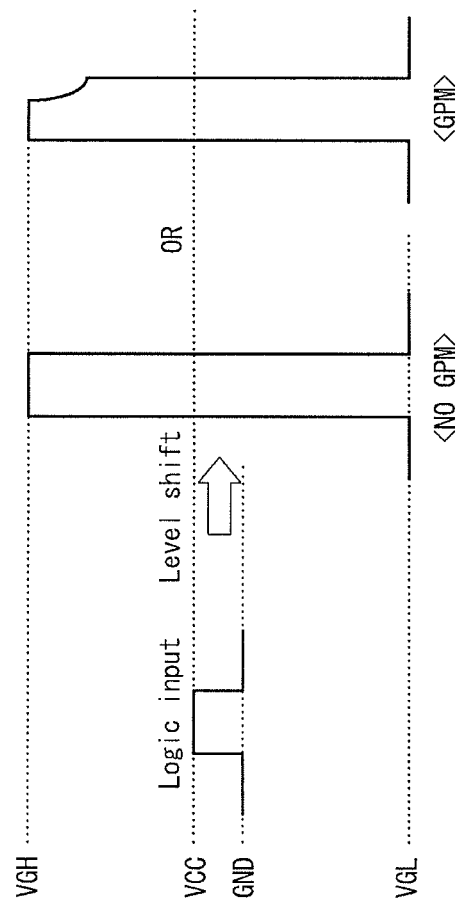
FIG. 12 is a waveform diagram of input and output signals of the level shifter shown in FIG. 11.

Each of the level shifters 15 level-shifts a TTL (transistor transistor logic) level voltage of the six-phase gate shift clocks clk1 to clk6 input from the timing controller 11, to have the gate high voltage VGH and the gate low voltage VGL, as shown in FIG. 12. Each of the level shifters 15 may modulate the gate high voltage VGH to have a lower level at the falling edges of the gate shift clocks clk1 to clk6, in response to a gate pulse modulation control signal FLK output from the timing controller 11. In FIG. 12, the reference numeral "GPM" denotes the gate shift clocks clk1 to clk6 of which the gate high voltage VGH is modulated in response to the signal FLK. When the gate high voltage VGH is modulated to be lowered at the falling edges of the gate shift clocks clk1 to clk6, waveforms of the scan pulses supplied for the scan lines in the display panel assembly 10 via the shift registers 13 are also modulated in the same form as the gate shift clocks clk1 to clk6. If the gate high voltage VGH is lowered at the falling edges of the scan pulses supplied for the scan lines, it is possible to improve a flicker, an afterimage, a color deviation or the like by reducing a kickback voltage (ΔVp).

Each shift register 13 comprises, as described above, the stages which sequentially generate the carry signals and the scan pulses by shifting the gate start pulses GSPF and GSPR in synchronization with the gate shift clocks clk1 to clk6. If the output nodes of the shift registers 13 are connected to the scan lines at both sides, one of the two shift registers 13 may be operated in the forward shift mode and the other may be operated in the reverse shift mode.

The scan driving circuit may be directly formed on a lower panel of the display panel assembly 10 by a GIP (gate in panel) scheme, or may be connected between the scan lines in the display panel assembly 10 and the timing controller 11 by the TAB scheme. By the GIP scheme, the level shifters 15 may be mounted on a PCB 14, and the shift registers 13 may be formed on the lower panel of the display panel assembly 10.

The timing controller 11 receives the digital video data RGB from an external device via an interface such as an LVDS (low voltage differential signaling) interface, a TMDS (transition minimized differential signaling) interface or the like. The timing controller 11 transmits the digital video data from the external device to the source drive ICs 12.

The timing controller 11 receives timing signals such as a vertical synchronizing signal Vsync, a horizontal synchronizing signal Hsync, a data enable signal DE, a main clock MCLK, and so forth, from the external device via an LVDS or a TMDS interface reception circuit. The timing controller 11 generates timing control signals for controlling operation timings of the data driving circuit and the scan driving circuit with respect to the timing signals from the external device. The timing control signals include scan timing control signals for controlling operation timings of the scan driving circuit, and data timing signals for controlling operation timings of the source drive ICs 12 and polarities of the data voltages.

The scan timing control signals include the gate start pulses GSPF and GSPR, the gate shift clocks clk1 to clk6, a gate output enable signal GOE (not shown), and so forth. The gate start pulses GSPF and GSPR are input to the shift registers 13 to control shift start timings. The gate shift clocks clk1 to clk6 are input to the level shifters 15 to be level-shifted, which are then input to the shift registers 13, and are used as clock signals for shifting the gate start pulses GSPF and GSPR. The gate output enable signal GOE controls output timings of the shift registers 13.

The data timing control signals include a source start pulse SSP, a source sampling clock SSC, a polarity control signal POL, a source output enable signal SOE, and so on. The source start pulse SSP controls shift start timings in the source drive ICs 12. The source sampling clock SSC is a clock signal which controls data sampling timings with respect to a rising edge or a falling edge in the source drive ICs 12. The polarity control signal POL controls polarities of the data voltages output from the source drive ICs 12. If a data transmission interface between the timing controller 11 and the source drive ICs 12 is a mini LVDS interface, the source start pulse SSP and the source sampling clock SSC may be omitted.

As described above, according to the embodiment of this document, even though the scan lines in the display device are short-circuited to each other, the carry signals and the scan pulses can be separately output to prevent a wrong operation of the shift register, and can be operated in the forward shift mode and the reverse shift mode.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A shift register comprising:
 a plurality of stages, which includes a (n−3)-th (where n is a positive integer) stage to a (n+3)-th stage, supplied with gate shift clocks that are sequentially delayed, a forward gate start pulse, a reverse gate start pulse, a carry signal, a gate high voltage, and a gate low voltage lower than the gate high voltage, and connected to each other in cascade,
 wherein the n-th stage, supplied with a (n−1)-th gate shift clock, an n-th gate shift clock, and a (n+1)-th gate shift clock, includes:

a scan pulse output unit configured to output an n-th scan pulse depending on a voltage at a Q node via a first output node;

a carry signal output unit configured to output an n-th carry signal depending on a voltage at the Q node via a second output node separated from the first output node; and a shift direction changing switch circuit configured to charge the Q node in response to a (n−3)-th carry signal output from the (n−3)-th stage, in a forward shift mode where the forward gate start pulse is generated, and, to charge the Q node in response to a (n+3)-th carry signal output from the (n+3)-th stage, in a reverse shift mode where the reverse gate start pulse is generated, wherein the n-th stage further comprises a Q node voltage maintaining switch circuit configured to charge the Q node in response to the (n−1)-th gate shift clock in the forward shift mode, and to charge the Q node in response to the (n+1)-th gate shift clock in the reverse shift mode.

2. The shift register of claim 1, wherein the shift direction changing switch circuit comprises:

a first thin film transistor (TFT) having a gate terminal which is applied with the (n−3)-th carry signal, a source terminal which is applied with the gate high voltage in the forward shift mode and applied with the gate low voltage in the reverse shift mode, and a drain terminal which is connected to the Q node; and a second TFT having a gate terminal which is applied with the (n+3)-th carry signal, a source terminal which is applied with the gate low voltage in the forward shift mode and applied with the gate low voltage in the reverse shift mode, and a drain terminal which is connected to the Q node.

3. The shift register of claim 1, wherein the Q node voltage maintaining circuit comprises:

a third TFT having a gate terminal, which is applied with the (n−1)-th gate shift clock, a source terminal, which is applied with a (n−1)-th carry signal output from the (n−1)-th stage, and a drain terminal, which is connected to the Q node; and a fourth TFT having a gate terminal, which is applied with the (n+1)-th gate shift clock, a source terminal, which is applied with a (n+1)-th carry signal output from the (n+1)-th stage, and a drain terminal, which is connected to the Q node.

4. The shift register of claim 1, wherein the carry signal output unit comprises:

a fifth TFT having gate terminal which is connected to the Q node, a drain terminal, which is connected to the first output node, and a source terminal, which is applied with the n-th gate shift clock;

a sixth TFT having a gate terminal, which is connected to a first QB node, a drain terminal, which is connected to the first output node, and a source terminal, which is applied with the gate low voltage, and charging the first output node depending on a voltage at the first QB node; and a seventh TFT having a gate terminal, which is connected to a second QB node, a drain terminal, which is connected to the first output node, and a source terminal, which is applied with the gate low voltage, and discharging the first output node depending on a voltage at the QB node, wherein the first QB node and the second QB node are charged alternately at a predetermined cycle.

5. The shift register of claim 4, wherein the carry signal output unit further comprises:

an eighth TFT having a gate terminal and a source terminal, which are applied with a first gate high voltage and short-circuited to each other, and a drain terminal, which is connected to the first QB node, and charging the first QB node to the first gate high voltage;

a ninth TFT having a gate terminal, which is connected to the Q node, a drain terminal, which is connected to the first QB node, and a source terminal, which is applied with the gate low voltage;

a tenth TFT having a gate terminal and a source terminal, which are applied with a second gate high voltage and short-circuited to each other, and a drain terminal, which is connected to the second QB node, and charging the second QB node to the second gate high voltage; and an eleventh TFT having a gate terminal, which is connected to the Q node, a drain terminal, which is connected to the second QB node, and a source terminal, which is applied with the gate low voltage.

6. The shift register of claim 5, wherein the first gate high voltage and the second gate high voltage are generated alternately at the predetermined cycle.

7. The shift register of claim 1, wherein the scan pulse output unit comprises:

a twelfth TFT having a gate terminal, which is connected to the Q node, a drain terminal, which is connected to the second output node, and a source terminal, which is applied with the n-th gate shift clock;

a thirteenth TFT having a gate terminal and a drain terminal, which are connected to the second output node, and a source terminal, which is applied with the n-th gate shift clock; and a fourteenth TFT having a gate terminal, which is applied with the n-th gate shift clock, a drain terminal, which is connected to the second output node, and a source terminal, which is applied with the gate low voltage.

8. The shift register of claim 1, wherein the n-th stage further comprises:

an initialization switch circuit configured to initialize the Q node in response to at least one of the forward gate start pulse and the reverse gate start pulse.

9. The shift register of claim 8, wherein the initialization switch circuit comprises:

a fifteenth TFT having a gate terminal, which is applied with the forward gate start pulse, a source terminal, which is applied with the gate low voltage, and a drain terminal, which is connected to the Q node; and a sixteenth TFT having a gate terminal, which is applied with the reverse gate start pulse, a source terminal, which is applied with the gate low voltage, and a drain terminal, which is connected to the Q node.

10. The shift register of claim 1, wherein the gate shift clocks are sequentially delayed and are generated as six-phase gate shift clocks of which high sections partially overlap to each other.

11. The shift register of claim 10, wherein the n-th carry signal and the n-th scan pulse partially overlap a (n−1)-th carry signal and a (n−1)-th scan pulse output from the (n−1)-th stage, respectively, and partially overlap a (n+1)-th carry signal and (n+1)-th scan pulse output from the (n+1)-th stage, respectively.

12. A display device comprising:

a display panel provided with a plurality of data lines and scan lines intersecting each other, and a plurality of pixels arranged in a matrix;

a data driving circuit configured to supply data voltages for the data lines; and a scan driving circuit configured to sequentially supply scan pulses for the scan lines, wherein the scan driving circuit has a plurality of stages, which includes a (n−3)-th (where n is a positive integer) stage to a (n+3)-th stage, supplied with gate shift clocks that are sequentially delayed, a forward gate start pulse, a reverse gate start pulse, a carry signal, a gate high voltage, and a gate low voltage lower than the gate high voltage, and connected to each other in cascade, and wherein the n-th stage, supplied with a (n−1)-th gate shift clock, an n-th gate shift clock, and a (n+1)-th gate shift clock, includes:

a scan pulse output unit configured to output an n-th scan pulse depending on a voltage at a Q node via a first output node;

a carry signal output unit configured to output an n-th carry signal depending on a voltage at the Q node via a second output node separated from the first output node; and a shift direction changing switch circuit configured to charge the Q node in response to a (n−3)-th carry signal output from the (n−3)-th stage, in a forward shift mode where the forward gate start pulse is generated, and, to charge the Q node in response to a (n+3)-th carry signal output from the (n+3)-th stage, in a reverse shift mode where the reverse gate start pulse is generated, wherein the n-th stage further comprises a Q node voltage maintaining switch circuit configured to charge the Q node in response to the (n−1)-th gate shift clock in the forward shift mode, and to charge the Q node in response to the (n+1)-th gate shift clock in the reverse shift mode.

13. The display device of claim 12, wherein the shift direction changing switch circuit comprises:
a first thin film transistor (TFT) having a gate terminal, which is applied with the (n−3)-th carry signal, a source terminal, which is applied with the gate high voltage in the forward shift mode and applied with the gate low voltage in the reverse shift mode, and a drain terminal, which is connected to the Q node; and
a second TFT having a gate terminal, which is applied with the (n+3)-th carry signal, a source terminal, which is applied with the gate low voltage in the forward shift mode and applied with the gate low voltage in the reverse shift mode, and a drain terminal, which is connected to the Q node.

14. The display device of claim 12, wherein the Q node voltage maintaining circuit comprises:
a third TFT having a gate terminal, which is applied with the (n−1)-th gate shift clock, a source terminal, which is applied with a (n−1)-th carry signal output from the (n−1)-th stage, and a drain terminal, which is connected to the Q node; and
a fourth TFT having a gate terminal, which is applied with the (n+1)-th gate shift clock, a source terminal, which is applied with a (n+1)-th carry signal output from the (n+1)-th stage, and a drain terminal, which is connected to the Q node.

15. The display device of claim 12, wherein the carry signal output unit comprises:

a fifth TFT having gate terminal, which is connected to the Q node, a drain terminal, which is connected to the first output node, and a source terminal, which is applied with the n-th gate shift clock;

a sixth TFT having a gate terminal, which is connected to a first QB node, a drain terminal, which is connected to the first output node, and a source terminal, which is applied with the gate low voltage, and charging the first output node depending on a voltage at the first QB node; and a seventh TFT having a gate terminal, which is connected to a second QB node, a drain terminal, which is connected to the first output node, and a source terminal, which is applied with the gate low voltage, and discharging the first output node depending on a voltage at the QB node, wherein the first QB node and the second QB node are charged alternately at a predetermined cycle.

16. The display device of claim 12, wherein the carry signal output unit comprises:
an eighth TFT having a gate terminal and a source terminal, which are applied with a first gate high voltage and short-circuited to each other, and a drain terminal, which is connected to the first QB node, and charging the first QB node to the first gate high voltage;
a ninth TFT having a gate terminal, which is connected to the Q node, a drain terminal, which is connected to the first QB node, and a source terminal, which is applied with the gate low voltage;
a tenth TFT having a gate terminal and a source terminal, which are applied with a second gate high voltage and short-circuited to each other, and a drain terminal, which is connected to the second QB node, and charging the second QB node to the second gate high voltage; and
an eleventh TFT having a gate terminal, which is connected to the Q node, a drain terminal, which is connected to the second QB node, and a source terminal, which is applied with the gate low voltage.

17. The display device of claim 12, wherein the scan pulse output unit comprises:
a twelfth TFT having a gate terminal, which is connected to the Q node, a drain terminal, which is connected to the second output node, and a source terminal, which is applied with the n-th gate shift clock;
a thirteenth TFT having a gate terminal and a drain terminal, which are connected to the second output node, and a source terminal, which is applied with the n-th gate shift clock; and
a fourteenth TFT having a gate terminal, which is applied with the n-th gate shift clock, a drain terminal, which is connected to the second output node, and a source terminal, which is applied with the gate low voltage.

18. The display device of claim 12, wherein the display panel is a display panel of any one of a liquid crystal display (LCD), an organic light emitting diode (OLED) display, and an electrophoresis display (EPD).

* * * * *